United States Patent
McLoughlin et al.

(10) Patent No.: US 9,941,565 B2
(45) Date of Patent: Apr. 10, 2018

(54) ISOLATOR AND METHOD OF FORMING AN ISOLATOR

(71) Applicant: Analog Devices Global, Hamilton (BM)

(72) Inventors: Conor John McLoughlin, Ballina (IE); Michael John Flynn, Waterford (IE); Laurence B. O'Sullivan, Limerick (IE); Shane Geary, Sixmilebridge (IE); Stephen O'Brien, Clarina (IE); Bernard P. Stenson, Limerick (IE); Baoxing Chen, Westford, MA (US); Sarah Carroll, Limerick (IE); Michael Morrissey, Limerick (IE); Patrick M. McGuinness, Pallaskenry (IE)

(73) Assignee: Analog Devices Global, Hamilton (BM)

(*) Notice: Subject to any disclaimer, the term of this patent is extended or adjusted under 35 U.S.C. 154(b) by 125 days.

(21) Appl. No.: 14/922,037

(22) Filed: Oct. 23, 2015

(65) Prior Publication Data

US 2017/0117602 A1   Apr. 27, 2017

(51) Int. Cl.
*H01P 1/36* (2006.01)
*H01P 5/18* (2006.01)

(52) U.S. Cl.
CPC .............. *H01P 1/36* (2013.01); *H01P 5/187* (2013.01)

(58) Field of Classification Search
CPC .................................. H01P 1/32; H01P 1/36
USPC ................................. 333/177, 185; 336/200
See application file for complete search history.

(56) References Cited

U.S. PATENT DOCUMENTS

| | | | |
|---|---|---|---|
| 6,614,643 B1 * | 9/2003 | Morita | H01L 28/40 257/E21.008 |
| 6,927,662 B2 | 8/2005 | Kahlmann et al. | |
| 7,489,526 B2 | 2/2009 | Chen et al. | |
| 7,947,600 B2 | 5/2011 | Iwaya et al. | |
| 8,237,534 B2 | 8/2012 | Fouquet et al. | |
| 8,364,195 B2 | 1/2013 | Spina et al. | |
| 8,378,776 B1 | 2/2013 | Gabrys et al. | |
| 8,427,844 B2 | 4/2013 | Ho et al. | |
| 8,446,243 B2 | 5/2013 | Strzalkowski et al. | |
| 8,519,506 B2 | 8/2013 | Hopper | |

(Continued)

FOREIGN PATENT DOCUMENTS

CN   104022113 A1   9/2014
DE   10 2005 025083 A1   12/2006

(Continued)

OTHER PUBLICATIONS

Extended European Search Report dated Jan. 20, 2017 for Application No. EP 16193510.1.

(Continued)

*Primary Examiner* — Stephen E Jones
(74) *Attorney, Agent, or Firm* — Wolf, Greenfield & Sacks, P.C.

(57) ABSTRACT

An isolator device and a corresponding method of forming the isolator device to include first and second electrodes, a layer of first dielectric material between the first and second electrodes, and at least one region of second dielectric material between the layer of first dielectric material and at least one of the first and second electrodes. The second dielectric material has a higher relative permittivity than the first dielectric material.

20 Claims, 4 Drawing Sheets

(56) References Cited

U.S. PATENT DOCUMENTS

| | | |
|---|---|---|
| 9,105,391 B2 | 8/2015 | Fouquet et al. |
| 2001/0011761 A1 | 8/2001 | Imoto |
| 2002/0052106 A1 | 5/2002 | Ikura |
| 2004/0026776 A1 | 2/2004 | Brand |
| 2004/0056749 A1 | 3/2004 | Kahlmann |
| 2005/0026351 A1 | 2/2005 | Farrar |
| 2006/0071309 A1 | 4/2006 | Kato |
| 2006/0075836 A1* | 4/2006 | Zribi .................. G01L 1/086 73/866.1 |
| 2006/0077028 A1 | 4/2006 | Huang |
| 2007/0121249 A1 | 5/2007 | Parker |
| 2008/0030080 A1 | 2/2008 | Chen et al. |
| 2008/0061631 A1 | 3/2008 | Fouquet |
| 2008/0179963 A1 | 7/2008 | Fouquet |
| 2008/0311862 A1 | 12/2008 | Spina et al. |
| 2009/0098735 A1 | 4/2009 | Cho |
| 2009/0104769 A1 | 4/2009 | Lee |
| 2009/0160011 A1 | 6/2009 | Park |
| 2009/0280314 A1 | 11/2009 | Mahler et al. |
| 2009/0280646 A1 | 11/2009 | Iwaya et al. |
| 2011/0095392 A1 | 4/2011 | Wahl et al. |
| 2012/0168901 A1 | 7/2012 | Santangelo et al. |
| 2012/0181874 A1 | 7/2012 | Willkofer et al. |
| 2014/0151856 A1 | 6/2014 | Otremba et al. |
| 2014/0151889 A1 | 6/2014 | Plekhanov et al. |
| 2014/0175602 A1 | 6/2014 | Funaya et al. |
| 2014/0252533 A1 | 9/2014 | O'Sullivan |
| 2015/0357113 A1 | 12/2015 | Scholz |
| 2017/0117084 A1 | 4/2017 | Murphy et al. |

FOREIGN PATENT DOCUMENTS

| | | |
|---|---|---|
| EP | 1 156 525 A1 | 11/2001 |
| EP | 2 348 572 A1 | 7/2011 |
| EP | 2 775 522 A1 | 9/2014 |
| GB | 2 132 817 A | 7/1984 |

OTHER PUBLICATIONS

Extended European Search Report dated Jun. 12, 2014 for European Application No. 14156529.1.

Examination Report dated Mar. 16, 2017 for European Application No. 14156529.1.

[No Author Listed], iCoupler® Technology: An Alternative to Optocouplers. Analog Devices, Inc. Published Jan. 24, 2011. http://www.youtube.com/watch?v=sHt12p03RSO.

[No Author Listed], Digital Isolators. Analog Devices. Retrieved Jun. 25, 2013 from http://www.analog.com/en/interface-isolation/digital-isolators/products/index.html. 8 pages.

\* cited by examiner

ISOLATOR AND METHOD OF FORMING AN ISOLATOR

FIELD OF THE INVENTION

Embodiments described herein relate for example to isolator devices and methods of manufacturing isolator devices.

BACKGROUND

Most electronic circuits are implemented within microelectronic circuits, commonly referred to as "chips". Such a chip comprises a semiconductor die carrying the microelectronic circuit encapsulated within a plastics case. This enables the chip to be bonded or soldered to circuit boards and the like for the formation into more complex products. Many applications of microelectronic circuitry may require interfacing from a relatively low voltage side, where for example the supply rails may differ from each other by only a few volts, to higher voltage components as might be found in the energy, signaling, automation, communications or motor control arenas. There are also safety critical applications such as medical applications, where high voltages must not be allowed to propagate from the circuit towards a patient being monitored. Although these high voltages may not be generated deliberately, they might occur in certain fault modes, for example if a power supply were to develop a fault. It is known to isolate low voltage and high voltage sides of a circuit from one another using "isolators". These have typically involved discrete components, such a signal transformers, being mounted on a circuit board between a low voltage side of the board and the high voltage side of the board. More recently "chip scale" isolators have become available. Within a "chip scale" isolator the low voltage and high voltage sides of the circuit are provided within a plastics package of the type known in the provision of integrated circuits, such as a dual in line package.

The reduced dimensions in chip scale isolators start to give rise to breakdown mechanisms not seen in non-chip scale, i.e. discrete component isolators. Isolators are often given a rating called the breakdown voltage. When the voltage across electrodes of the isolator exceeds the breakdown voltage, the dielectric material between the electrodes may exhibit electrical breakdown and become electrically conductive, no longer performing as an effective isolator.

To increase the breakdown voltage, an isolator can be manufactured with a thicker layer of dielectric material between the electrodes.

SUMMARY

According to a first embodiment there is provided an isolator device comprising first and second electrodes, a layer of first dielectric material between the first and second electrodes, and at least one region of second dielectric material between the layer of first dielectric material and at least one of the first and second electrodes, wherein the second dielectric material has a higher relative permittivity than the first material. Also provided is an electronic device including the isolator device of the first embodiment.

According to a second embodiment there is provided a method of forming an isolator device, comprising, forming a first electrode over a substrate, forming a layer of first dielectric material over the first region, and forming a second electrode over the first layer. The method further comprises forming at least one region of second dielectric material between the first electrode and the layer of first dielectric material, and/or between the layer of first dielectric material and the second electrode. Accordingly, the method further comprises at least one of: (i) forming a region of a second dielectric material over at least part of the first electrode and before the forming of the layer of first dielectric material, and (ii) forming a region of a second dielectric material over the layer of first dielectric material and before the forming of the second electrode. The second dielectric material has a higher relative permittivity than the first material.

BRIEF DESCRIPTION OF THE FIGURES

Embodiments will now be described by way of example only with reference to the accompanying Figures, in which.

DETAILED DESCRIPTION OF EMBODIMENTS

Figure 1:
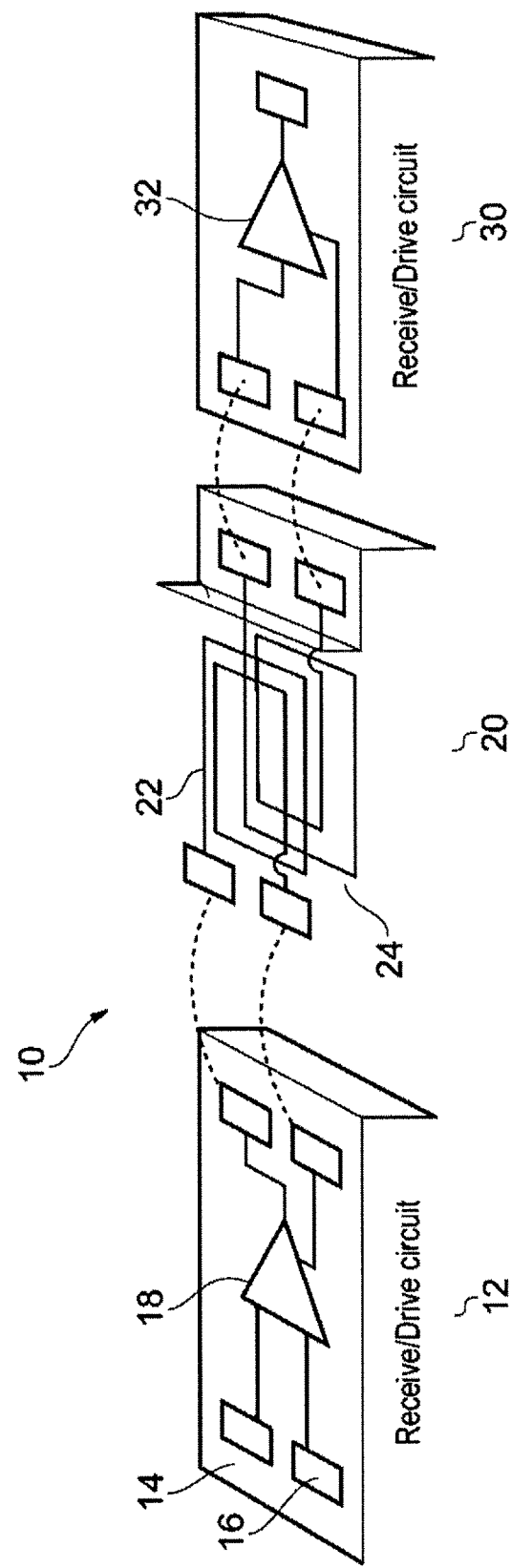
FIG. 1 shows an example of an electronic system or device.

FIG. 1 schematically represents the components within an example signal isolator system 10 which acts to receive an input signal at the first voltage or a first voltage range, which may be a relatively high voltage, and to convey it at a lower voltage for processing by further components, not shown, such as a microprocessor. Such an isolator system 10 comprises a receive circuit 12 that has input terminals 14 and 16 for receiving an input signal, and processing electronics 18 which acts to convert the signal into a form suitable for transmission across an isolation circuit 20. The processing electronics 18 may, for example, encode a voltage by converting it to the frequency domain, or may encode a logic signal by providing a high frequency sinusoid to the isolation circuit when the logic signal is asserted, and inhibiting provision of the sinusoid to the isolation circuit when the logic signal is not asserted. The isolation circuit 20 in this example comprises a first transformer coil 22 and a second transformer coil 24. The coils may be separated by an insulating material. An output of the coil 22 is provided to an output circuit 30 where a further electronic circuit 32 processes the signals received from the second coil 24 in order to reconstitute a representation of the input signal provided to the drive circuit 12. The arrangement shown in FIG. 1 is highly simplified, and, for example, a single channel may include two transformers such that the signal can be conveyed in a differential manner, or in a phase or frequency modulated manner. Additionally, it may be desirable to send signals back from the low voltage side of the circuit 30 to the higher voltage side 12, and therefore each element may be provided in a bi directional manner, and the isolator may be used to convey signals in a bi directional manner, or additional isolators may be provided such that some of the isolators may be dedicated for transmission of data in one direction and other of the isolators may be dedicated for the transmission of data in a second direction. Furthermore, if the input receiver circuitry 12 is unable to derive power from the equipment that it is connected to, then it is also possible to use the transformers to provide power to run the receiver circuit.

As shown in FIG. 1, the receiver circuit 12, the isolator 20, and the output circuit 30 have been provided on respective substrates. In the example shown, the receiver at the high voltage side and the low voltage output side circuit 30 are provided on respective substrates, but either of those substrates may optionally incorporate the isolator 20. Although shown as an example with magnetically, inductively coupled transformer coils, embodiments described herein may alternatively be applied to other technologies such as capacitively coupled isolators, such as those that use plate electrodes instead of coil electrodes.

Figure 2:
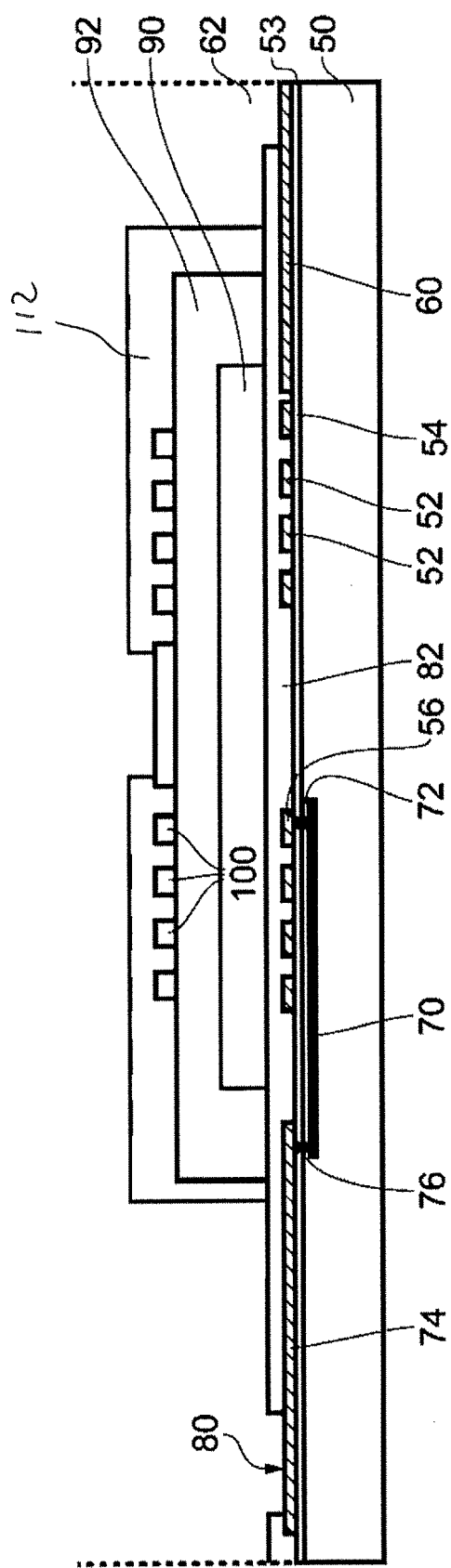
FIG. 2 shows an example of an isolator device.

FIG. 2 is a cross section through an embodiment of an isolator 20. The diagram is not to scale, and in particular the thickness of the substrate 50 may be greater than shown in FIG. 2. In the arrangement shown in FIG. 2 a substrate 50, such as a semiconductor wafer, acts as a carrier for the insulating structure used to form a transformer based signal isolator. A first electrode comprising a first coil 52 formed as a spiraling metal track is provided over the surface of the substrate 50. A layer of insulator 53 such as silicon dioxide insulates the metal track from the substrate. The metal track may be formed of Aluminum, Gold or any other suitable metal. Other conducting materials may also be used. The nature of a spiral track is that a connection is made to a radially outermost most part 54 of the spiral 52 and that a connection must also be made to radially innermost part 56 of the spiral 52. The connection to the outermost part 54 can be easily accomplished by extending the metal layer used to form the spiral such that it forms a track 60 extending towards a bond pad region 62. A connection to the innermost portion 56 of the spiral may be made in any suitable fashion but in this example is made in a plane above or below the plane of the spiral. In the arrangement shown in FIG. 2 an interconnection 70 is provided below the plane of the spiral conductor 52, for example by forming a highly doped region or a further metal layer 70 which connects to the innermost part 56 by way of a first via 72 and which connects to a further section of metal track 74 by way of a further via 76. Thus a further insulation oxide layer (not shown) may lie beneath the metal layer 70 so as to insulate it from the substrate. The further section of metal track 74 extends towards a bond pad region 80. The metal tracks may be covered by a thin layer of passivation 82, such as silicon dioxide, or some other insulator, except in the regions of the bond pads 62 and 80 where the passivation is etched away. The fabrication of such structures is known to the person skilled in the art and need not be described further here.

The manner in which connections are made to the electrode 52 or any other electrode is shown merely as an example, and other connection techniques may be used.

It is known to the person skilled in the art that insulators can typically withstand the maximum electric field across them before dielectric breakdown occurs and a conductive path opens through the insulator layer(s) between the electrodes. The electric field is expressed in volts per unit distance, and hence typically higher breakdown voltages may be achieved through increased thickness of the insulator. However, the local electric field in some regions, particularly regions proximate to the electrodes, may still increase with higher voltages, even with increased insulator thickness, leading to breakdown of the device. In order to reduce the electric field between the electrodes, hence potentially avoiding breakdown in regions proximate to the electrodes, a material for the insulator may be chosen that has a higher relative permittivity, though such materials generally have a lower breakdown voltage and hence may not provide an isolator device with a higher breakdown voltage rating.

Polyimide is a compound which is suitable for use as an insulator as it has a breakdown voltage of around 800 to 900 volts per µm, and is also relatively easy to work with within the context of semiconductor fabrication processes and is largely self planarising. Other insulating materials that are commonly used in integrated circuit fabrication include BCB and SU8. Other insulating polymers and oxides may also be used. As shown in FIG. 2, a first layer of insulator 90, for example of polyimide, is deposited over the region of the substrate 50 and the passivation 82 in which the first coil 52 is formed. Then a second overlapping layer 92 of insulator, such as polyimide is formed over the first region 90 so as to build up an additional thickness of the insulator. The ends of the region 92 may be allowed to wrap around the ends of the region 90, such that the insulating structure increases in both depth and lateral extent. Each deposition step may increase the thickness of the insulator by, in the case of polyimide, between 10 to 16 microns for example. Thus after two deposition steps the insulator layers 90 and 92 may together be between 20 and 32 microns thick. If necessary or desirable further layers can be deposited to form thicker structures. Next a second metallic layer 100 is deposited over the layer 92 and patterned, for example to form a second spiral track which co-operates with the first spiral track to form a transformer. The second metal layer 100 may be of aluminium or another suitable metal such as gold. As with the first conductive spiral track, connections may be made to both an innermost portion of the spiral and an edge portion. For diagrammatic simplicity the connection to the outer edge portion has been omitted, whereas the central portion may be connected to a bond pad region 110.

Following formation of the second spiral conductive track 100, a third layer 112 of insulator, such as polyimide, is deposited over the second layer 92 and over the spiral track 100. The layer 112 may extend beyond and overlap the second layer 92. After formation of the layer 112 it is masked and then selectively etched so as to open up a connection aperture 113 to the bond pad 110.

Figure 3:
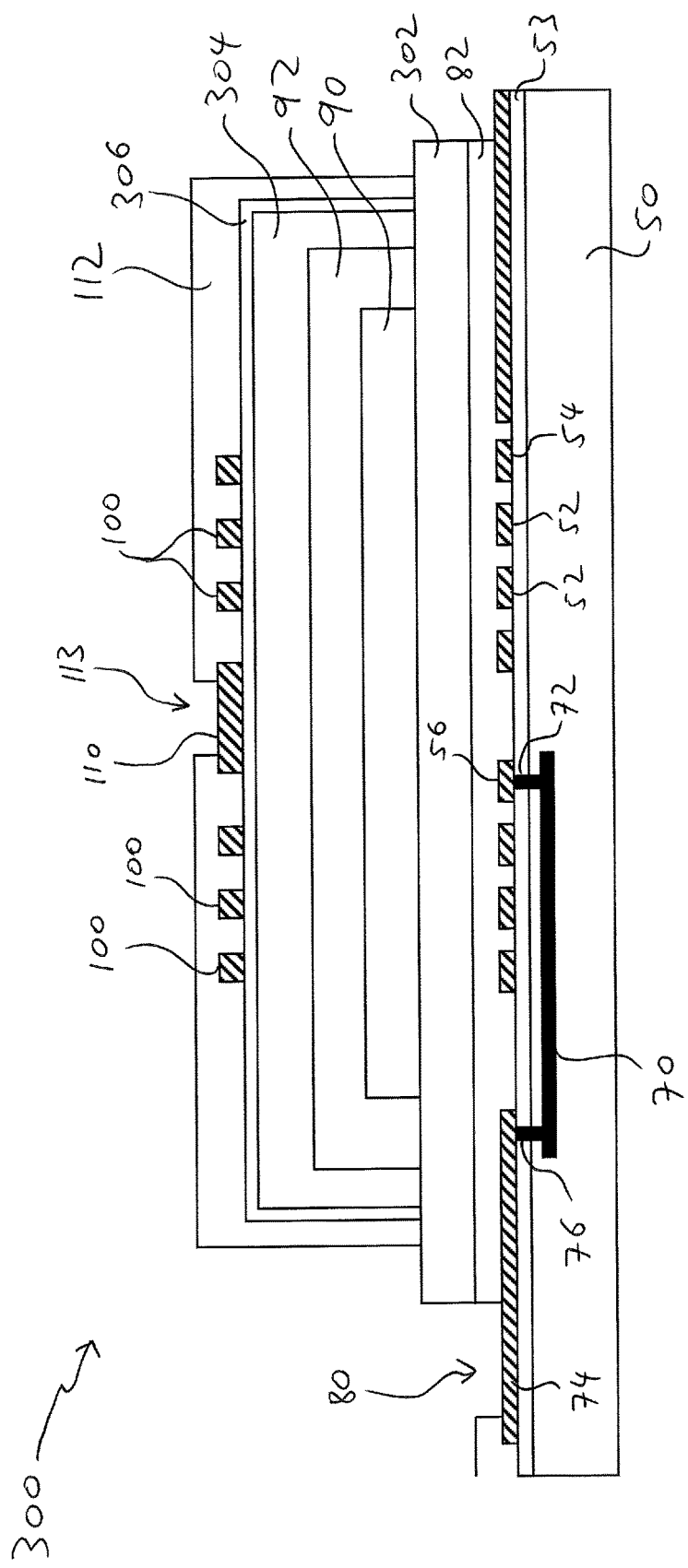
FIG. 3 shows another example of an isolator device.

FIG. 3 shows an example embodiment of an isolator device 300. The isolator device includes some features similar to those shown in FIG. 2 and described above, and are given like reference numerals in FIGS. 2 and 3. These features are not described further herein.

The isolator device 300 differs from that shown in FIG. 2 through the inclusion of additional layers 302, 304 of dielectric material and an additional passivation layer 306.

A first layer of second dielectric material 302 is formed over the first passivation layer 82 and underneath the first layer 90 of the first dielectric material (e.g. polyimide). The second dielectric material has a higher relative permittivity (dielectric constant) than the layers 90 and 92 of polyimide or other dielectric material. Examples of the second dielectric material include silicon nitride (SiN), sapphire ($Al_2O_3$), tantalum pentoxide ($Ta_2O_5$), strontium titanate ($SrTiO_3$), bismuth ferrite ($BiFeO_3$) and barium strontium titinate (BST). This is however not an exhaustive list and other materials may be used. Additionally or alternatively, different layers of high relative permittivity material could use different materials.

Thus the first layer 302 of second dielectric material may be formed after the passivation layer 82 (and after the first electrode 52) and before the insulating layer or layers of first dielectric material between the electrodes. The process of forming the first layer 302 may be integrated with the process of forming other layers in some cases. For example, to form an opening to expose the bond pad region 80, the passivation layer 82 and first layer 302 of second dielectric material may be masked and etched simultaneously, though this can alternatively be done separately for each layer.

A second layer 304 of dielectric material is located over the layer or layers of first dielectric material 90 and 92. The second layer 304 may be of the same material as the first layer 302, or may be of a different material, though both layers 302 and 304 have a higher relative permittivity than the material used to form the layers 90 and 92. In the example shown, the edges of the layer 304 are allowed to wrap around the edges of the layers 90 and 92. As such, the layers 90 and 92 are encapsulated within the layers 302 and 304 of higher relative permittivity.

An additional passivation layer 306 is provided over the layer 304 and is allowed to wrap around the edges of the layer 304. The second electrode comprising a coil 100 is then formed over the additional passivation layer 306, and includes suitable connections. For example, a bond pad 110 is provided for an electrical connection to an inner part of the coil 100, and another connection (not shown) can also be made to an outer part of the coil 100.

Figure 4:
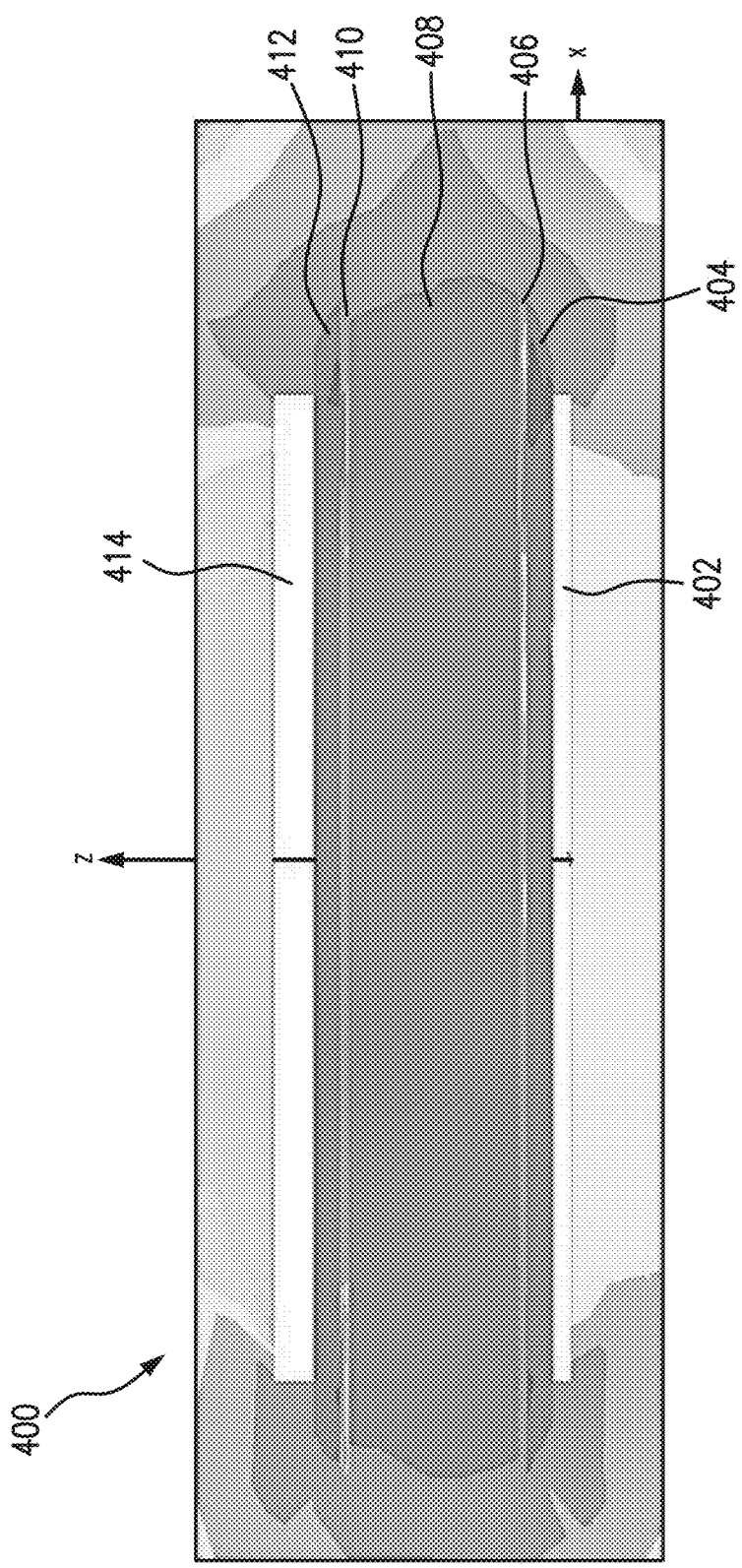
FIG. 4 shows a simulation of electrical field within an example isolator device.

FIG. 4 shows a simulation of an electric field within a cross section of an isolator device 400 according to an embodiment. A darker region indicates a stronger electric field. The isolator device 400 includes a first electrode 402, a first passivation layer 404, a first dielectric layer 406, one or more second dielectric layers 408, a third dielectric layer 410, a second passivation layer 412 and a second electrode 414. The layer or layers 408 have a lower relative permittivity than the layers 406 and 410. The layers 406 and 410 may be formed from the same material as each other, and thus may have the same relative permittivity, though in some embodiments the layers 406 and 410 may be made from different dielectric materials. Thus they may have the same or different relative permittivity, though still higher than the layer 408.

The layers 404-412 are shown as having a symmetric arrangement between the electrodes 402 and 414, and example thicknesses of the layers are as follows: the first passivation layer 404 of between around 0.1 and 5 microns, such as 3 microns thickness; the first dielectric layer 406 of 1 micron; the one or more second dielectric layers 408 of between around 10 and 80 microns, such as 20 microns in total; the third dielectric layer 410 of 1 micron; and the second passivation layer 412 of between around 0.1 and 5 microns, such as 3 microns. However, in alternative embodiments, the layers may have other thicknesses, and/or may also show a non-symmetric arrangement between the electrodes 402 and 414.

In the example of FIG. 4, the simulation is shown whereby a high voltage is applied across the two electrodes 402 and 414. It can be seen that the darkest regions, and thus the regions within the device with the strongest electric field, are near to the electrodes, and in particular near the edges of the electrodes. It can further be seen that the presence of the layers 406 and 410, having a higher relative permittivity than the layer(s) 408, tends to confine the regions of strongest electric field away from the layer(s) 408 and within the passivation layers 404 and 412. As a result, the voltage across the electrodes may be increased further before breakdown of the dielectric layers, and hence the device, when compared to an isolator device that does not include the layers 406 and 410.

The layers of higher relative permittivity shown in FIGS. 3 and 4 are applied to those isolator devices merely as examples, and any suitable isolator device may include one or more layers of higher relative permittivity dielectric material to provide the benefits described herein. One or more layers of dielectric material with a higher relative permittivity, such as the layers 406 and 410 in FIG. 4 and the layers 302 and 304 in FIG. 3, in an isolator device may have additional benefits. For example, depending on materials selected, these layers may also act as a charge injection barrier between the electrodes and the lower relative permittivity dielectric layers, and may also act as a moisture barrier. Additionally or alternatively, in some embodiments, one or more of the passivation layers may not be present. In such cases, a different layer may be present between the electrode and the region of higher relative permittivity dielectric material, or the region of higher relative permittivity dielectric material may be formed directly on or around the electrode, or the electrode may be formed directly on or within the region of higher relative permittivity dielectric material.

In some embodiments, an entire layer of higher permittivity dielectric material may not be deposited. Instead, select regions may be formed in certain areas of the device. For example, regions of higher permittivity dielectric material bay be formed proximate to edges of one or both electrodes, in order to push the peak electric field away from the lower relative permittivity layer(s), and the higher relative permittivity regions may be not present within at least a portion of the layer of lower relative permittivity between the electrodes, and may be not present within a majority of the layer of lower relative permittivity between the electrodes.

Some embodiments may use only one layer of higher relative permittivity dielectric material, between the layer(s) of lower permittivity dielectric material and one of the electrodes, which may provide at least some of the benefits provided by two-layer embodiments such as those shown in FIGS. 3 and 4. Other embodiments may additionally or alternatively include additional layers to those described above and shown in the Figures.

It is intended that the foregoing description is intended to illustrate and not to limit the scope of this disclosure and the scope of protection, which is defined by the appended claims. Other embodiments are within the scope of the claims.

The invention claimed is:

1. An isolator device comprising:
   first and second electrodes;
   a layer of a first dielectric material between the first and second electrodes;
   a first layer of a second dielectric material between the layer of first dielectric material and the first electrode; and
   a second layer of the second dielectric material between the layer of first dielectric material and the second electrode,
   wherein the second dielectric material has a higher relative permittivity than the first dielectric material.

2. The device of claim 1, wherein the first layer of the second dielectric material is located proximate edges of the first electrode and the second layer of the second dielectric material is located proximate edges of the second electrode.

3. The device of claim 1, wherein each of the first and second electrodes comprises a plate or coil.

4. The device of claim 1, wherein a thickness of the layer of first dielectric material is between around 10 µm and around 80 µm.

5. The device of claim 1, wherein a thickness of the first and second layers of the second dielectric material is around 1 µm.

6. The device of claim 1, wherein one of the first and second electrodes is formed on a substrate.

7. The device of claim 1, wherein the first dielectric material is polyimide, and/or the second dielectric material is one of silicon nitride, sapphire, tantalum pentoxide, strontium titanate, bismuth ferrite and barium strontium titanate.

8. The device of claim 1, wherein the first and second layers of the second dielectric material substantially surround the layer of first dielectric material.

9. The device of claim 1,
further comprising a region of a third dielectric material between the layer of first dielectric material and at least one of the first or second electrodes.

10. The device of claim 9, wherein the second dielectric material is different from the third dielectric material.

11. The device of claim 9, wherein the second dielectric material is the same as the third dielectric material.

12. The device of claim 9, wherein the third dielectric material has a higher relative permittivity than the first dielectric material.

13. The device of claim 1, wherein the first layer of the second dielectric material does not contact the first electrode and/or the second layer of the second dielectric material does not contact the second electrode.

14. The device of claim 13, wherein the first layer of the second dielectric material is separated from the first electrode by between around 0.1 µm and around 5 µm and the second layer of the second dielectric material is separated from the second electrode by between around 0.1 µm and around 5 µm.

15. The device of claim 13, further comprising:
a further layer between the first layer of the second dielectric material and the first electrode or between the second layer of the second dielectric material and the second electrode.

16. The device of claim 15, wherein the further layer is a passivation layer.

17. An isolator device comprising:
first and second electrodes;
at least one region of a first dielectric material between the first and second electrodes;
a first layer of a second dielectric material between the region of first dielectric material and the first electrode; and
a second layer of the second dielectric material between the region of first dielectric material and the second electrode,
wherein the second dielectric material has a higher relative permittivity than the first dielectric material.

18. The device of claim 17, wherein the at least one region of first dielectric material comprises at least one layer of first dielectric material between the first layer of second dielectric material and the second layer of second dielectric material.

19. The isolator device of claim 17, wherein the first layer of the second dielectric material is located proximate edges of the first electrode and the second layer of the second dielectric material is located proximate edges of the second electrode.

20. An electronic device including an isolator device, wherein the isolator device comprises:
first and second electrodes;
a layer of a first dielectric material between the first and second electrodes;
a first layer of a second dielectric material between the layer of first dielectric material and the first electrode; and
a second layer of the second dielectric material between the layer of first dielectric material and the second electrode,
wherein the second dielectric material has a higher relative permittivity than the first dielectric material.

* * * * *